US012609698B2

(12) United States Patent
Lai et al.

(10) Patent No.: US 12,609,698 B2
(45) Date of Patent: Apr. 21, 2026

(54) CMOS DATA CLEARING CIRCUIT

(71) Applicant: ASRock Industrial Computer Corporation, Taipei City (TW)

(72) Inventors: Yu-Lin Lai, Taipei City (TW); Yu-Tso Chen, Taipei City (TW); Shih-Ming Lin, Taipei City (TW)

(73) Assignee: ASRock Industrial Computer Corporation, Taipei City (TW)

( * ) Notice: Subject to any disclaimer, the term of this patent is extended or adjusted under 35 U.S.C. 154(b) by 109 days.

(21) Appl. No.: 18/591,711

(22) Filed: Feb. 29, 2024

(65) Prior Publication Data

US 2024/0364332 A1     Oct. 31, 2024

(30) Foreign Application Priority Data

Apr. 26, 2023     (TW) ................................. 112115444

(51) Int. Cl.
    *H03K 17/687*        (2006.01)
    *H03K 5/00*          (2006.01)
    *H03K 5/01*          (2006.01)
(52) U.S. Cl.
    CPC ........... *H03K 17/6871* (2013.01); *H03K 5/01* (2013.01); *H03K 2005/00078* (2013.01)
(58) Field of Classification Search
    CPC ................. H03K 17/6871; H03K 5/01; H03K 2005/00078; G06F 1/24
    See application file for complete search history.

(56) References Cited

U.S. PATENT DOCUMENTS

| | | | |
|---|---|---|---|
| 2011/0072252 A1* | 3/2011 | Liu ........................ | G09G 5/006 |
| | | | 713/1 |
| 2011/0225414 A1* | 9/2011 | Zhou ........................ | G06F 1/24 |
| | | | 713/100 |
| 2012/0044096 A1 | 2/2012 | Huang et al. | |

FOREIGN PATENT DOCUMENTS

CN          206270863 U  *  6/2017

OTHER PUBLICATIONS

Asustek Computer Inc., "How to clear CMOS?," published on Dec. 30, 2021, available at: https://www.asus.com/US/support/FAQ/1040820.

* cited by examiner

*Primary Examiner* — Metasebia T Retebo
(74) *Attorney, Agent, or Firm* — J.C. PATENTS

(57)          ABSTRACT

A CMOS data clearing circuit is provided. The CMOS data clearing circuit is configured to clear CMOS data of a main board of an electronic device. The electronic device includes a control chip and a pin header. The CMOS data clearing circuit includes a controller and a connection port. The controller generates a pulse signal and an operation signal. The connection port has an input pin and an output pin. The output pin is coupled to a first pin of the pin header. The connection port connects the input pin to the output pin in response to the operation signal, so as to transmit the pulse signal to the first pin of the pin header via the output pin. The control chip clears the CMOS data of the main board according to the pulse signal received by the first pin.

10 Claims, 4 Drawing Sheets

CMOS DATA CLEARING CIRCUIT

CROSS-REFERENCE TO RELATED APPLICATION

This application claims the priority benefit of Taiwan application serial no. 112115444, filed on Apr. 26, 2023. The entirety of the above-mentioned patent application is hereby incorporated by reference herein and made a part of specification.

BACKGROUND

Technical Field

The disclosure generally relates to a data clearing circuit, and more particularly to a data clearing circuit for cleaning CMOS data of an electronic device.

Description of Related Art

Electronic devices encounter system instability, unstable power supply, etc. and cannot operate smoothly (or crash). Therefore, a user stops the electronic device from receiving power (for example, force shutdown, removes the power cord or battery), disassembles the casing of the electronic device, and finds a pin header for clearing CMOS data.

Generally, the pin header has three pins. A first pin of the pin header is floating. A second pin of the pin header is connected to the control chip of the electronic device. A third pin of the pin header is connected to a reference low voltage (for example, ground). The user first connects the second pin to the third pin using a jumper. After a few seconds, the user connects the second pin to the first pin and disconnects the connection between the second pin and the third pin.

It should be noted that the above operations on the pin header are performed by the user, such that the above operations consume labor costs and time costs. Therefore, how to provide a mechanism for automatically clearing CMOS data that can save labor costs and time costs is one of the research focuses of those skilled in the art.

SUMMARY

The disclosure provides a CMOS data clearing circuit that can control an electronic device to clear CMOS data.

The CMOS data clearing circuit of the disclosure is used to clear the CMOS data of the main board of the electronic device. The electronic device includes a control chip and a pin header. The CMOS data clearing circuit includes a controller and a connection port. The controller generates a pulse signal and operation signals. The connection port has an input pin and an output pin. The output pin is coupled to a first pin of the pin header. The connection port conducts the input pin to the output pin in response to the operation signal, so as to transmit the pulse signal to the first pin of the pin header via the output pin. The control chip clears the CMOS data of the main board according to the pulse signal received by the first pin.

Based on the above, the controller generates a pulse signal in response to the operation signal. The control chip automatically clears the CMOS data in the main board based on the voltage variation of the pulse signal. In this way, the labor cost and time cost required for clearing CMOS data could be saved.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
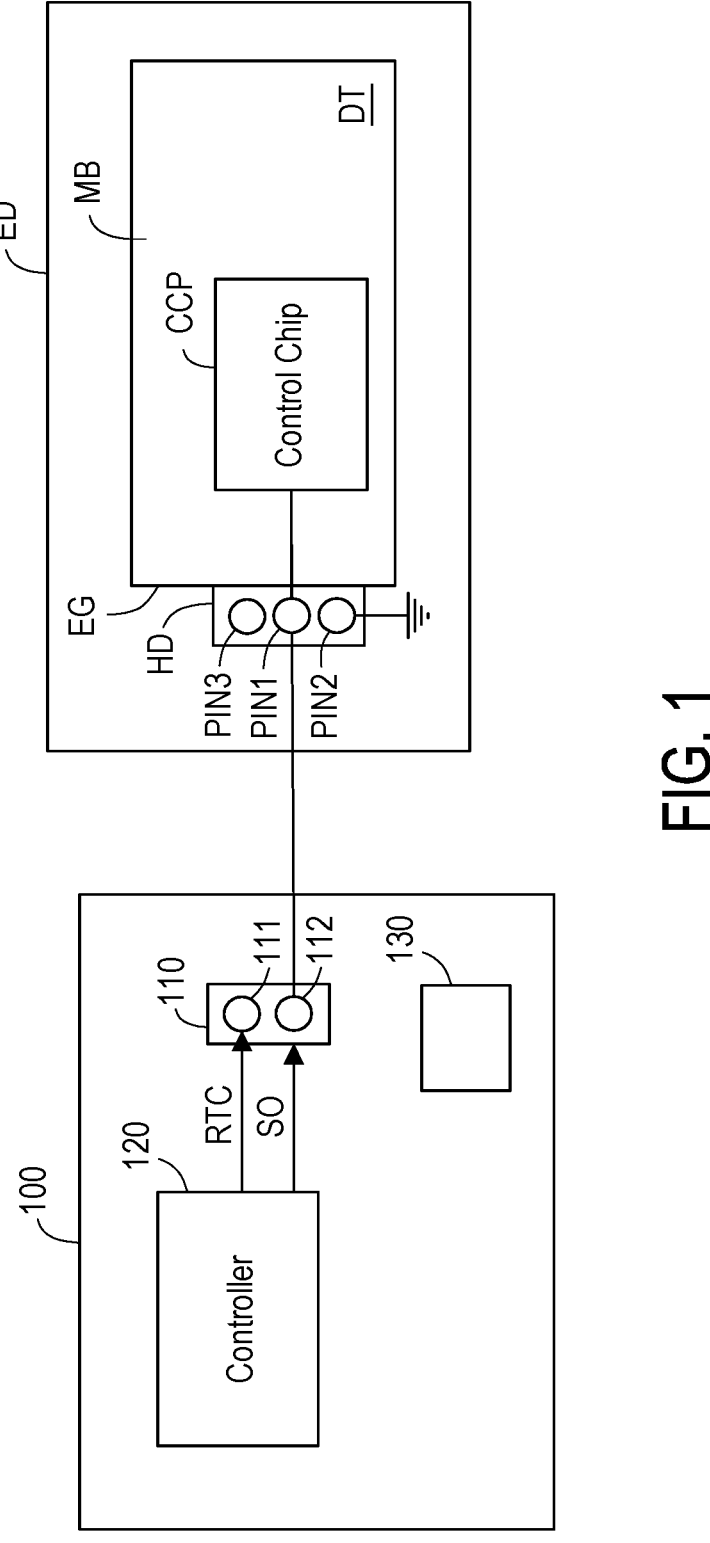
FIG. 1 illustrates a schematic diagram of a CMOS data clearing circuit according to an embodiment of the disclosure.

Some embodiments of the disclosure accompanied with the drawings will now be described in detail. In the reference numerals recited in description below, the same reference numerals shown in different drawings will be regarded as the same or similar elements. These embodiments are only a part of the disclosure and do not disclose all possible implementations of the disclosure. To be more precise, these embodiments are only examples of the appended claims of the disclosure.

Please refer to FIG. 1, FIG. 1 illustrates a schematic diagram of a CMOS data clearing circuit according to an embodiment of the disclosure. In the embodiment, the CMOS data clearing circuit 100 is used to clear a CMOS data DT of an electronic device ED. The electronic device ED is, for example, a personal computer, a notebook computer, a tablet computer, or any form of system host, but the disclosure is not limited thereto. The electronic device ED includes a control chip CCP, a pin header HD and a main board MB. The control chip CCP clears the CMOS data DT based on the voltage variation of pins of the pin header HD. The control chip CCP is, for example, a South bridge chip. The control chip CCP and pin header HD are disposed on the main board MB. The pin header HD includes pins PIN1, PIN2 and PIN3. The pin PIN1 is coupled to the control chip CCP. The pin PIN2 is coupled to a reference low voltage (for example, ground). The pin PIN3 is floated.

In the embodiment, the CMOS data clearing circuit 100 includes a connection port 110 and a controller 120. The CMOS data clearing circuit 100 can be detachably connected to the pin header HD through the connection port 110. The controller 120 is operated to generate the pulse signal RTC and the operation signal SO. The connection port 110 has an input pin 111 and an output pin 112. The output pin 112 is coupled to the pin PIN1 of the pin header HD. The connection port 110 conducts the input pin 111 to the output pin 112 in response to the operation signal SO, so as to transmit the pulse signal RTC to the pin PIN1 via the output pin 112. Therefore, the control chip CCP can receive the pulse signal RTC via the pin PIN1, and clear the CMOS data DT of the main board MB based on the voltage variation of the pulse signal RTC.

For example, when receiving the operation signal SO, the input pin 111 is shorted to the output pin 112. On the other hand, when the operation signal SO is not received, the input pin 111 and the output pin 112 are electrically isolated from each other.

In an embodiment, the CMOS data clearing circuit 100 can connect or cut-off the electrical connection between the input pin 111 and the output pin 112 by a switching element (not shown). For example, one terminal of the switching element is electrically connected to the input pin 111, and another terminal of the switching element is electrically connected to the output pin 112. When receiving the operation signal SO, the switching element is turned on in response to the operation signal SO. Therefore, the input pin 111 is electrically connected to the output pin 112. When the operation signal SO is not received, the switching element is turned off. The input pin 111 and the output pin 112 are electrically isolated from each other.

For example, the CMOS data DT is data stored in a random-access memory (RAM) provided on the main board MB.

In the embodiment, when receiving the operation signal SO, the connection port 110 conducts the input pin 111 to the output pin 112. The input pin 111 is electrically connected to the pin PIN1 of the pin header HD via the output pin 112. When the pulse signal RTC on the input pin 111 transitions from a high voltage value to a low voltage value, the low voltage value of the pulse signal RTC is equal to the voltage value of the reference low voltage. In other words, a voltage value of the output pin 112 is substantially equal to the voltage value of the pin PIN2. It can be seen that the connection port 110 simulates the operation state in which the pin PIN1 is connected to the pin PIN2. Therefore, the control chip CCP clears the CMOS data DT.

On the other hand, when the operation signal SO is not received, the input pin 111 and the output pin 112 are electrically isolated from each other. The pin PIN1 is not electrically connected to the input pin 111. It can be seen that the connection port 110 simulates the operation state in which the pin PIN1 is connected to the pin PIN3. Therefore, the control chip CCP does not clear the CMOS data DT.

It is worth mentioning here that the controller 120 generates the pulse signal RTC to the input pin 111. The control chip CCP automatically clears the CMOS data DT located in the main board MB based on the voltage variation of the pulse signal RTC. A user does not need to manually use a jumper to operate pin header HD. In this way, the labor cost and time cost required for clearing CMOS data can be saved.

In the embodiment, the pin header HD may be disposed on an edge EG of the main board MB. The output pin 112 can be connected to the header pin PIN1 at the edge EG. Therefore, when an abnormality occurs in the electronic device ED, the CMOS data clearing circuit 100 is easily connected to the pin header HD. Thus, convenience of use of the CMOS data clearing circuit 100 could be improved.

In the embodiment, the CMOS data clearing circuit 100 further includes an activation component 130. The activation component 130 is coupled to the connection port 110 and the controller 120.

For example, the activation component 130 may be a button, a key or a jumper. When the abnormality occurs in the electronic device ED, the user connects the output pin 112 to the pin PIN1 and operates the activation component 130. When the activation component 130 is operated, the controller 120 provides the operation signal SO. In other words, the controller 120 generates the operation signal SO and the pulse signal RTC in response to the user's operation on the activation element 130. Therefore, the input pin 111 and the output pin 112 are short-circuited and the pulse signal RTC is provided to the pin PIN1. The pulse signal RTC simulates the operation state of the pin PIN1 being connected to the pin PIN2. Thus, the control chip CCP clears the CMOS data DT.

Figure 2:
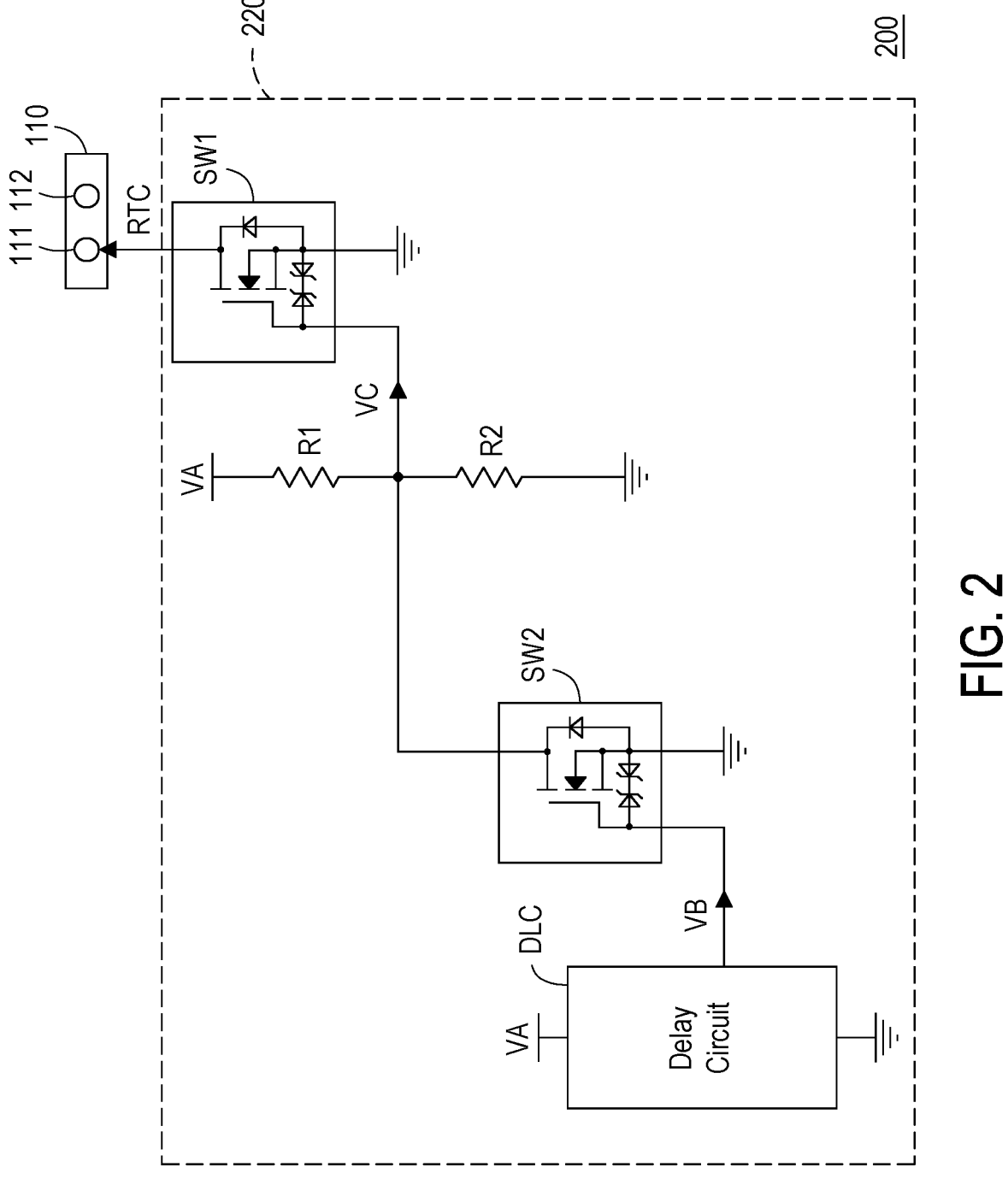
FIG. 2 illustrates a schematic circuit diagram of a CMOS data clearing circuit according to an embodiment of the disclosure.

Please refer to FIG. 2, FIG. 2 illustrates a schematic circuit diagram of a CMOS data clearing circuit according to an embodiment of the disclosure. In the embodiment, the CMOS data clearing circuit 200 includes a connection port 110 and a controller 220. The implementation details of the connection port 110 have been clearly explained in the embodiment of FIG. 1, so it will not be repeated here. The controller 220 generates a control signal VA. For example, the controller 220 generates the control signal VA in response to the user's operation on the activation element 130. The controller 220 delays the control signal VA to generate a delayed signal VB, and generates the pulse signal RTC according to the control signal VA and the delayed signal VB.

In the embodiment, the controller 220 includes switches SW1 and SW2, resistors R1 and R2, and a delay circuit DLC. The switch SW1 has a first terminal, a second terminal and a control terminal. The first terminal of the switch SW1 is coupled to the input pin 111 of the connection port 110. The second terminal of the switch SW1 is coupled to the reference low voltage. Resistor R1 has a first terminal and a second terminal. The first terminal of the resistor R1 receives the control signal VA. The second terminal of the resistor R1 is coupled to the control terminal of the switch SW1. The resistor R2 is coupled between the control terminal of the switch SW1 and the reference low voltage. The delay circuit DLC receives the control signal VA and delays the timing of the control signal VA to generate the delayed signal VB. The switch SW2 has a first terminal, a second terminal and a control terminal. The first terminal of the switch SW2 is coupled to the control terminal of the switch SW1. The second terminal of the switch SW2 is coupled to the reference low voltage. The control terminal of the switch SW2 is coupled to the delay circuit DLC. The control terminal of the switch SW2 receives the delayed signal VB.

In the embodiment, the switches SW1 and SW2 may be implemented by transistors or transmission gates. Taking the embodiment as an example, the switches SW1 and SW2 are respectively implemented by any form of N-type field-effect transistor (FET), but the disclosure is not limited thereto.

Figure 3:
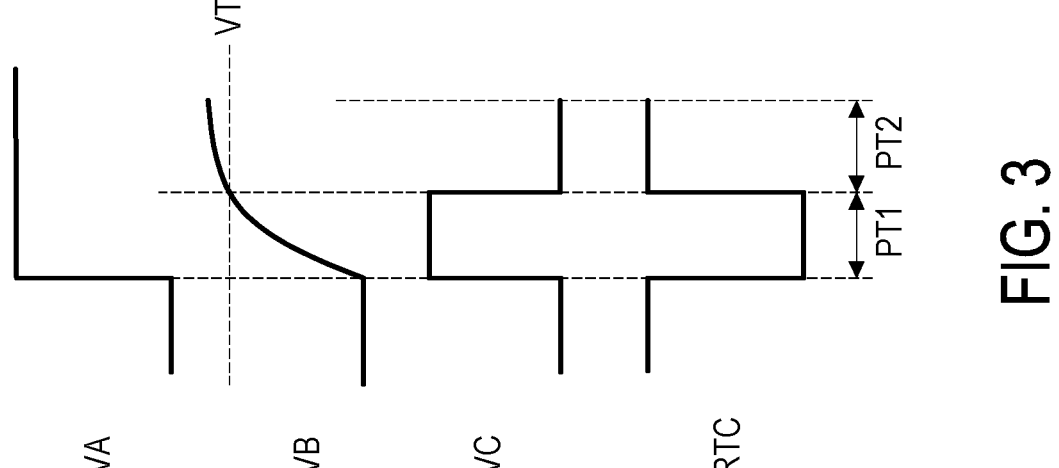
FIG. 3 illustrates a timing diagram according to an embodiment of the disclosure.

Please refer to FIG. 1, FIG. 2 and FIG. 3, FIG. 3 illustrates a timing diagram according to an embodiment of the disclosure. In the embodiment, the control signal VA may be a DC voltage signal (but the disclosure is not limited thereto). When the controller 220 generates the control signal VA, during a first period PT1, the switch SW1 is turned on in response to the control signal VA. Furthermore, the rising time of the rising edge of the delayed signal VB is delayed, and the voltage value of the delayed signal VB is lower than or equal to a threshold voltage value VT of the switch SW2. Therefore, the switch SW2 is turned off in response to the delay signal VB. The resistors R1 and R2 divide the control signal VA to generate the control signal VC. The rising time of the rising edge of the control signal VC is not delayed. Therefore, during the first period PT1, the switch SW1 is turned on in response to the high voltage value of the control signal VA. A voltage value of the pulse signal RTC is pulled down to a low voltage value.

In addition, during the first period PT1, the input pin 111 is electrically connected to the output pin 112. Therefore, the voltage value of the output pin 112 is substantially equal to the voltage value of the pin PIN2. It can be seen that the connection port 110 simulates the operation state in which the pin PIN1 is connected to the pin PIN2. Therefore, the control chip CCP clears the CMOS data DT.

During a second period PT2 later than the first period PT1, the voltage value of the delay signal VB is higher than the threshold voltage value VT of the switch SW2. Therefore, the switch SW2 is turned on in response to the delay signal VB, thereby turning off the switch SW1. Furthermore, during the second period PT2, the switch SW2 is turned on to pull down the voltage value of the control signal VC to a low voltage value. Therefore, the switch SW1 is turned off. So that the input pin 111 is floated during the second period PT2. It can be seen that the connection port 110 simulates the operation state in which the pin header pin PIN1 is connected to the pin header pin PIN3. Therefore, the control chip CCP stops or finishes clearing the CMOS data DT.

In the embodiment, the time length of the first period PT1 may be determined by the delay circuit DLC.

Figure 4:
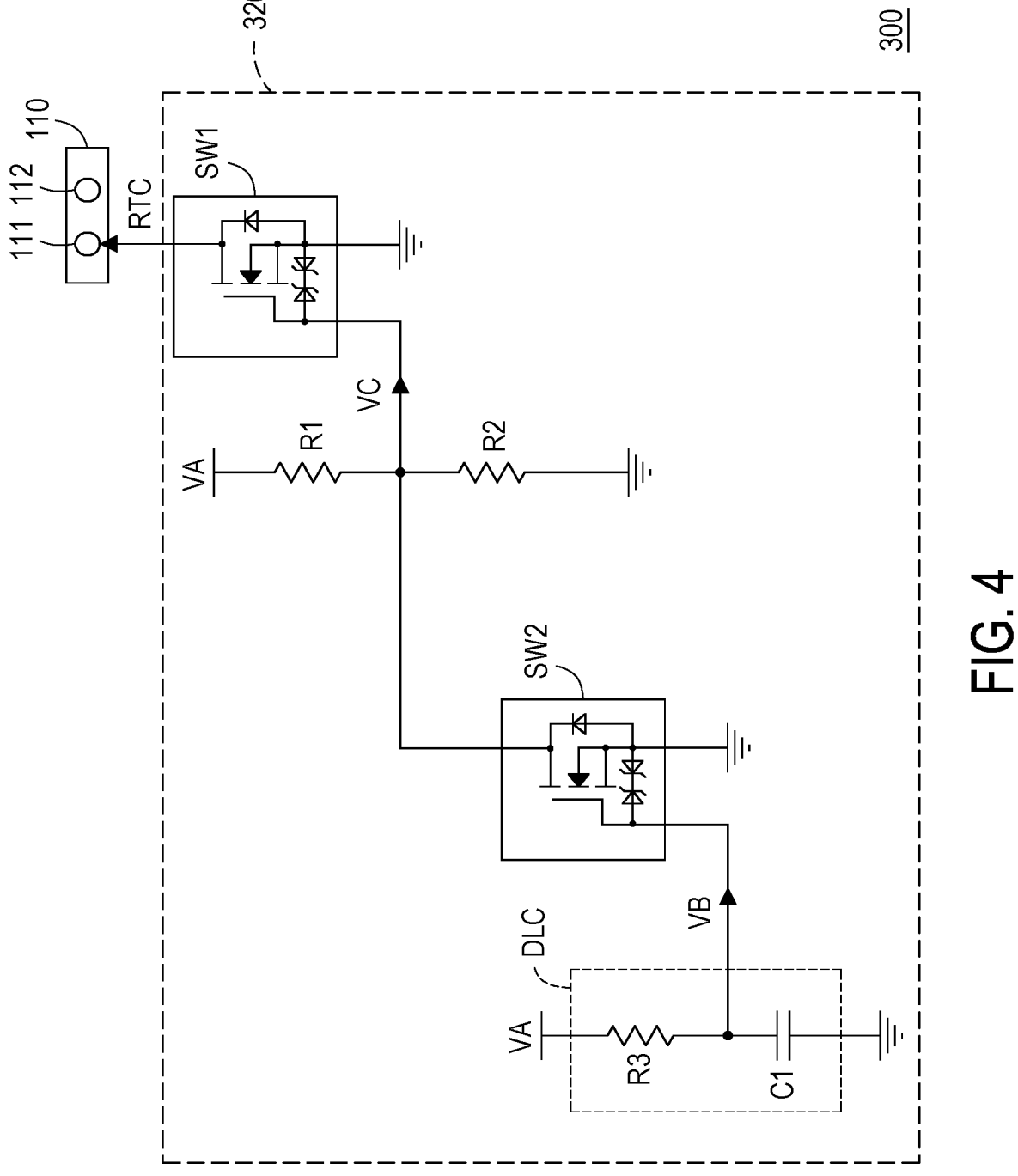
FIG. 4 illustrates a schematic circuit diagram of a CMOS data clearing circuit according to an embodiment of the disclosure.

FIG. 4 illustrates a schematic circuit diagram of a CMOS data clearing circuit according to an embodiment of the disclosure. Please refer to FIG. 4, in the embodiment, the CMOS data clearing circuit 300 includes a connection port 110 and a controller 320. The controller 320 includes switches SW1, SW2, resistors R1, R2, and a delay circuit DLC. The implementation of the switches SW1 and SW2 and the resistors R1 and R2 is the same as the implementation of the switches SW1 and SW2 and the resistors R1 and R2 in FIG. 2, so it will not be repeated here. In the embodiment, the delay circuit DLC includes a delay resistor R3 and a delay capacitor C1. The first terminal of the delay resistor R3 receives the control signal VA. The second terminal of the delay resistor R3 is coupled to the control terminal of the switch SW2. The delay capacitor C1 is coupled between the control terminal of the switch SW2 and the reference low voltage. Therefore, the delay circuit DLC can determine the rise time of the rising edge of the delay signal VB based on a resistance value of the delay resistor R3 and a capacitance value of the delay capacitor C1. Therefore, the delay circuit DLC can determine the maintenance time length of the low voltage value of the pulse signal RTC based on the resistance value of the delay resistor R3 and the capacitance value of the delay capacitor C1.

In view of the foregoing, the CMOS data clearing circuit generates a pulse signal on the input pin. The control chip automatically clears the CMOS data of the main board based on the voltage change of the pulse signal. The user does not need to manually use a jumper to operate the pin header. In this way, the labor cost and time cost required for clearing CMOS data can be saved. In additional, the pin header can be placed on the edge of the main board. Therefore, when an abnormality occurs in the electronic device, the CMOS data clearing circuit is easily connected to the pin header. Thereby improving the ease of use of the CMOS data clearing circuit.

Although the disclosure has been described with reference to the above embodiments, they are not intended to limit the disclosure. It will be apparent to one of ordinary skill in the art that modifications to the described embodiments may be made without departing from the spirit and the scope of the disclosure. Accordingly, the scope of the disclosure will be defined by the attached claims and their equivalents and not by the above detailed descriptions.

What is claimed is:

1. A CMOS data clearing circuit for clearing CMOS data of a main board of an electronic device, wherein the electronic device comprises a control chip and a pin header, and the CMOS data clearing circuit comprises:
    a controller, configured to generates a pulse signal and an operation signal; and
    a connection port, having an input pin and an output pin, wherein the input pin is coupled to the controller, the output pin is coupled to a first pin of the pin header, the connection port conducts the input pin to the output pin in response to the operation signal, so as to transmit the pulse signal to the first pin of the pin header via the output pin, and the control chip clears the CMOS data according to the pulse signal received by the first pin.

2. The CMOS data clearing circuit of claim 1, wherein the pin header is disposed on an edge of the main board.

3. The CMOS data clearing circuit of claim 1, wherein when the pulse signal transitions from a high voltage value to a low voltage value, the control chip clears the CMOS data.

4. The CMOS data clearing circuit of claim 3, wherein a second pin of the pin header is coupled to a reference low voltage, and the low voltage value of the pulse signal is equal to a voltage value of the reference low voltage.

5. The CMOS data clearing circuit of claim 1, wherein the controller is further configured to generate a control signal, generate a delayed signal according to the control signal, and generate the pulse signal according to the control signal and the delayed signal.

6. The CMOS data clearing circuit of claim 5, wherein the controller comprises:
    a first switch, having a first terminal, a second terminal and a control terminal, wherein the first terminal of the first switch is coupled to the input pin, and the second terminal of the first switch is coupled to a reference low voltage;
    a first resistor, having a first terminal and a second terminal, wherein the first terminal of the first resistor receives the control signal, and the second terminal of the first resistor is coupled to the control terminal of the first switch;
    a second resistor, coupled between the control terminal of the first switch and the reference low voltage;
    a delay circuit, configured to receive the control signal and delay a timing of the control signal to generate the delayed signal; and
    a second switch, having a first terminal, a second terminal and a control terminal, wherein the first terminal of the second switch is coupled to the control terminal of the first switch, the second terminal of the second switch is coupled to the reference low voltage, and the control terminal of the second switch receives the delayed signal.

7. The CMOS data clearing circuit of claim 6, wherein the delay circuit comprises:
    a delay resistor, having a first terminal and a second terminal, wherein the first terminal of the delay resistor receives the control signal, and the second terminal of the delay resistor is coupled to the control terminal of the second switch; and
    a delay capacitor, coupled between the control terminal of the second switch and the reference low voltage.

8. The CMOS data clearing circuit of claim 6, wherein when a voltage value of the delayed signal is lower than or equal to a threshold voltage value of the second switch, the second switch is turned off, the first switch is turned on in response to a high voltage value of the control signal, so as to pull down a voltage value of the pulse signal to a low voltage value.

9. The CMOS data clearing circuit of claim 8, wherein when a voltage value of the delayed signal is higher than the threshold voltage value of the second switch, the second switch is turned on to turn off the first switch, causing the input pin to be floated.

10. The CMOS data clearing circuit of claim 1, further comprising:

an activation component, coupled to the controller, wherein when the activation component is operated, the controller provides the operation signal.

* * * * *